United States Patent [19]
Nagahara et al.

[11] Patent Number: 5,786,126
[45] Date of Patent: Jul. 28, 1998

[54] ANTI-TACK LAYER FOR PHOTOPOLYMER PRINTING PLATE AND COMPOSITION FOR FORMING THE SAME

[75] Inventors: Shigenori Nagahara; Akira Tomita; Noriko Takahashi; Masaru Nampei, all of Ootsu, Japan

[73] Assignee: Toyo Boseki Kabushiki Kaisha, Osaka, Japan

[21] Appl. No.: 444,878

[22] Filed: May 19, 1995

Related U.S. Application Data

[62] Division of Ser. No. 206,831, Mar. 7, 1994, abandoned.

[30] Foreign Application Priority Data

Mar. 17, 1993 [JP] Japan ................... 5-057209
Jan. 18, 1994 [JP] Japan ................... 6-003626

[51] Int. Cl.$^6$ .................................. G03C 1/492
[52] U.S. Cl. .............. 430/273.1; 428/483; 428/516; 428/523; 430/300; 430/306
[58] Field of Search ................... 428/483, 516, 428/523; 524/104, 173, 211, 233, 387, 388, 503; 525/57, 58

[56] References Cited

U.S. PATENT DOCUMENTS

| | | |
|---|---|---|
| 3,721,557 | 3/1973 | Inoue ............................ 96/28 |
| 3,775,108 | 11/1973 | Arai et al. ................. 525/57 X |
| 4,041,204 | 8/1977 | Hepher et al. ............... 428/199 |
| 4,065,524 | 12/1977 | Laridon et al. ........... 525/57 X |
| 4,225,652 | 9/1980 | Mercer et al. ............... 428/515 |
| 4,247,576 | 1/1981 | Kutner ........................ 427/40 |
| 4,266,007 | 5/1981 | Hughes et al. ............ 430/306 |
| 4,268,601 | 5/1981 | Namiki et al. ............. 430/159 |
| 4,332,873 | 6/1982 | Hughes et al. ............... 430/15 |
| 4,469,837 | 9/1984 | Cattaneo .................... 524/388 |
| 4,530,747 | 7/1985 | Dönges et al. .......... 204/159.16 |
| 4,741,969 | 5/1988 | Hayama et al. ............. 428/514 |
| 4,762,892 | 8/1988 | Koch et al. ................. 525/279 |
| 4,789,211 | 12/1988 | Wreede ...................... 350/3.61 |
| 4,916,045 | 4/1990 | Koch et al. ................. 430/270 |
| 5,006,586 | 4/1991 | Touji et al. ................. 524/388 |
| 5,093,401 | 3/1992 | Claussen et al. ........... 524/388 |
| 5,186,978 | 2/1993 | Woodhall et al. .......... 524/388 |
| 5,236,812 | 8/1993 | Vassiliou et al. .......... 430/327 |
| 5,281,514 | 1/1994 | Desie et al. ................. 430/533 |
| 5,374,501 | 12/1994 | Holmes et al. ............. 430/273 |
| 5,407,784 | 4/1995 | Bernier et al. ............. 430/287 |

FOREIGN PATENT DOCUMENTS

| | | |
|---|---|---|
| 0705477 | 3/1965 | Canada. |
| 45-32959 | 10/1970 | Japan. |

*Primary Examiner*—Judy M. Reddick
*Attorney, Agent, or Firm*—Foley & Lardner

[57] ABSTRACT

Disclosed herein are an adhesive or anti-tack layer for photopolymer printing plate capable of development with aqueous or semi-aqueous processing liquid, characterized in having an absorbance of 0.010 to 0.060 per μm thickness at 1140 cm$^{-1}$ and also a composition for forming the adhesive layer defined above, characterized in containing polyvinyl alcohol and a water-soluble a crystallizing agent having a boiling point of 120°–240° C. The adhesive layer is resistant to wrinkling and superior in storage stability. It can be produced efficiently.

16 Claims, 1 Drawing Sheet

ANTI-TACK LAYER FOR PHOTOPOLYMER PRINTING PLATE AND COMPOSITION FOR FORMING THE SAME

This application is a division of application Ser. No. 08/206,831, now abandoned filed Mar. 7, 1994.

BACKGROUND OF THE INVENTION

1. Field of the Invention

The present invention relates to an anti-tack (hereinafter and sometimes referred to also as "adhesive") layer for photopolymer printing plates, especially those for flexographic printing which are developable with an aqueous or semi-aqueous treating liquid. The present invention relates also to a composition for forming such anti-tack layer.

2. Description of the Prior Art

Production of a photopolymer printing plate usually involves its exposure to active light through an original film in close contact with the photosensitive layer under vacuum. There is an increasing demand for rubber-like flexible printing plates than before which are necessary for business form printing. With a decreasing hardness, the photosensitive surface of the printing plate stock tends to become tacky.

The printing plate stock with a tacky surface does not allow uniform contact with the original film, which leads to poor image reproduction. In addition, it causes difficulty in peeling the original film off the exposed printing plate stock, with both the original film and plate stock damaged. General practice to solve these problems is to coat the photosensitive surface with a thin non-tacky film made from, for example, polyvinyl alcohol (more than 90% saponification degree), polyvinyl alcohol (with a saponification degree of 70–90%, degree of polymerization higher than 800), water-soluble polymer, and soluble polyamide, which are disclosed respectively in JP-A 51-49803, 52-110010, 54-68224, and 56-110941.

There is great necessity to obtain an anti-tack or adhesive layer in the case of photopolymer plate for flexographic printing because of its softness and tackiness and its strong tendency toward fine wrinkle formation. Therefore there has been proposed, for a flexographic printing plate, to provide an additional release layer as disclosed in JP-A 57-208556. Further, incorporation of a polyvinyl alcohol with a plasticizer for the prevention of wrinkling is disclosed in JP-A 2-113254. The present inventors have previously invented a composition for an anti-tack layer for flexographic printing plate, said composition being composed of polyvinyl alcohol and glycerin in an amount of 4–8 wt % of the total weight of the composition. It is disclosed in JP-A 4-130325. These prior art technologies have the following disadvantages.

Providing a photopolymer printing plate stock with a release layer needs an additional process and coating the release layer with an anti-tack layer needs a sophisticated coating technology. Polyvinyl alcohol incorporated with a plasticizer (which is low molecular weight polyethylene glycol in an amount of at least 8% of the total weight of the releasing composition) (JP-A 2-113254) is so susceptible to moisture that it becomes tacky or adhesive, rather than adhesive, under humid conditions. The polyvinyl alcohol composition containing a limited amount of glycerin is certainly effective in the prevention of wrinkle formation (JP-A 4-130325). On the other hand, it causes the mist formation in the course of production process and the mist dews to contaminate the production facilities. Moreover, the glycerin content in the composition tends to fluctuate depending on humidity. This leads to poor quality (non-uniformity) and low productivity.

The prior art technology has not been successful with an adhesive or anti-tack agent for the water-developable, flexible photopolymer printing plates. The one incorporated with glycerin prevents wrinkling but poses a problem with misting which contaminates the platemaking machine. In other words, the conventional adhesive agent involves problems to be solved from the standpoint of productivity and environmental protection.

In addition, it suffers a disadvantage of being liable to wrinkling. This is the case when the cover film is not peeled from the adhesive layer in a single stroke. The formation of stripe-shaped wrinkles occurs at the place where peeling is suspended and resumed. It is difficult to prevent the occurrence of such stripe-shaped wrinkles because peeling is often carried out in two or more strokes.

Moreover, the conventional adhesive or anti-tack layer on the photopolymer printing plate becomes wrinkled while the printing plate is held flat to peel off the cover film. It also becomes wrinkled when the printing plate is deformed in either concave or convex direction and then flattened again. This makes it necessary to avoid moving the photopolymer printing plate once its cover film has been removed. In fact, it is difficult to move the photopolymer printing plate without deforming the same.

SUMMARY OF THE INVENTION

It is the first object of the present invention to provide an adhesive or anti-tack layer which permits development with an aqueous or semi-aqueous treating liquid and does not become wrinkled after the cover film has been peeled off.

It is the second object of the present invention to provide a composition for said adhesive layer which does not cause the mist formation during processing and is resistant to humidity.

The first aspect of the present invention resides in an adhesive or anti-tack layer for the photopolymer printing plate capable of development with water or aqueous or semi-aqueous processing or treating liquid, characterized in having an absorbance of 0.010 to 0.060 per μm thickness of said layer at 1140 cm$^{-1}$.

The second aspect of the present invention resides in a composition for forming said adhesive layer, characterized in containing polyvinyl alcohol and a water-soluble crystallizing agent compound having a boiling point of 120°–240° C.

DETAILED DESCRIPTION OF THE INVENTION

Figure 1:
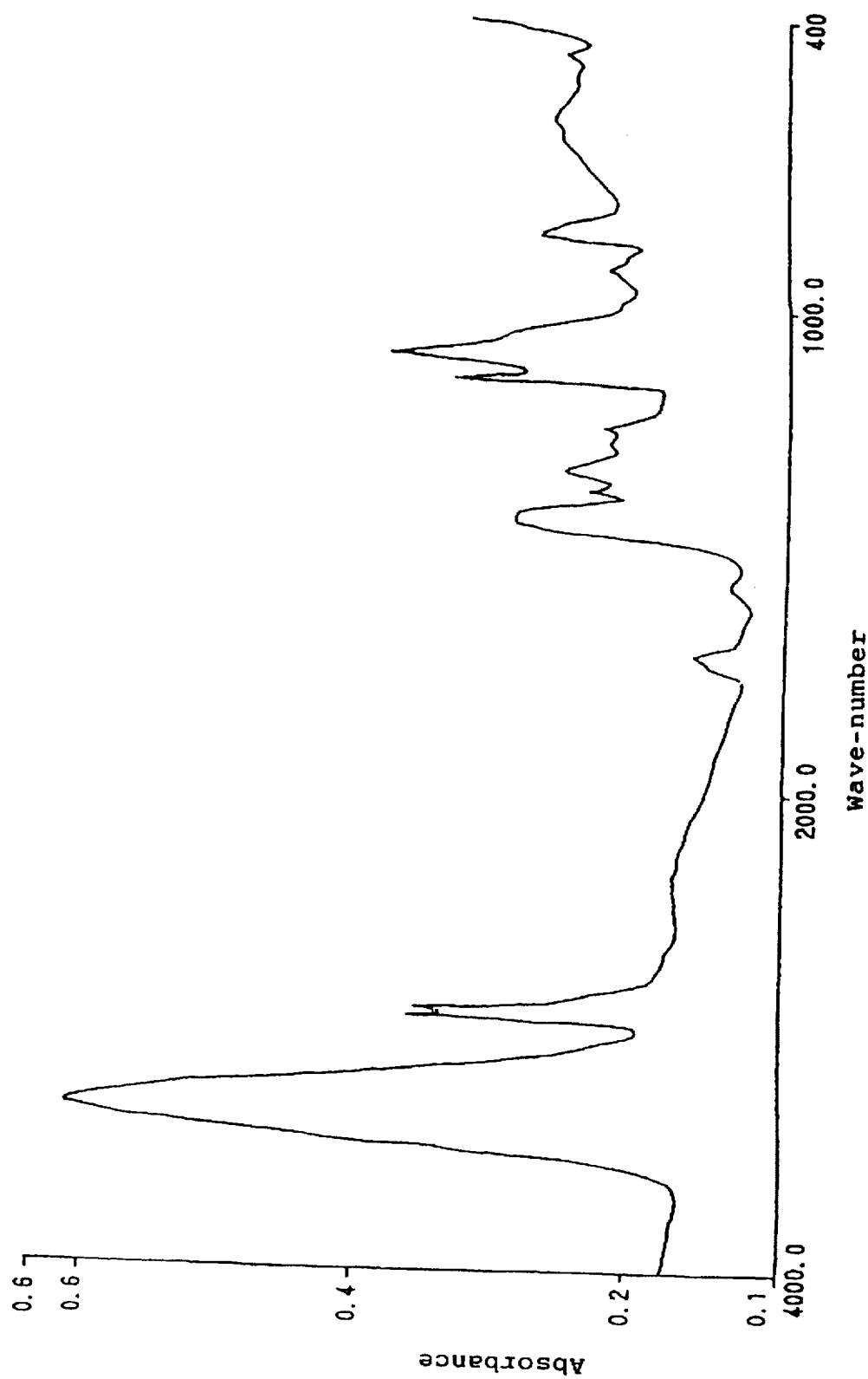
FIG. 1 is an IR spectrum of the adhesive layer obtained in Example 2.

According to the present invention, the adhesive layer is formed mainly from polyvinyl alcohol obtained by the hydrolysis or saponification of esters of polyvinyl alcohols. The degree of saponification should preferably be higher than 70%, particularly higher than 98%, for desired solubility in an aqueous medium. According to the present invention, the adhesive or anti-tack layer has an absorbance of 0.010 to 0.060 per μm thickness at 1140 cm$^{-1}$. This means that the adhesive layer is crystalline by nature to some extent in view of the fact that polyvinyl alcohol has an absorption band at about 1140 cm$^{-1}$ due to crystals. The absorbance is measured in the following manner.

Measurement of absorbance: The adhesive layer is peeled off the photopolymer layer. Held between KBr plates, it is examined for IR spectrum by the transmission method. A line is drawn from the trough (valley) of absorption of the spectrum at about 1160 $cm^{-1}$ to the trough (valley) of absorption of the spectrum at about 950 $cm^{-1}$. A second line is drawn which parallels the first one and passes through the trough (valley) of absorption of the spectrum at about 1130 $cm^{-1}$. This second line is regarded as the base line for absorbance at 1140 $cm^{-1}$, and the height of absorption at 1140 $cm^{-1}$ from the base line is regarded as the absorbance at 1140 $cm^{-1}$.

Area of sample: 15 mm×15 mm

Apparatus: FT-IR (TGS detector)

Resolving power: 8 $cm^{-1}$

Accumulation: 300 times

Method: Transmission method

The adhesive or anti-tack layer of the present invention is used as a constituent of the laminate for photopolymer printing plate. The laminate is composed of a support, an adhesive layer, a photopolymer (photosensitive resin) layer, an adhesive (anti-tack) layer, and a cover film. It is produced by coating a cover film with an adhesive, coating a support with an adhesive, and sandwiching a photopolymer composition in a desired thickness and width between the coated cover film and the coated support by hot-pressing, casting, calendering, or coating. Polyethylene terephthalate film is most suitable for the cover film because of its dimensional stability, heat resistance, and mechanical properties. Polyethylene film, polypropylene film, and polystyrene film may also be used alone or in the form of laminate so long as they are peelable. The cover film may have either a smooth surface or a matte surface with a surface roughness lower than 5 μm. The latter permits one to tell one side form the other easily and hence is desirable.

According to the present invention, the adhesive layer is formed on the cover film by coating from an aqueous solution containing 1–15%, preferably 2–5%, polyvinyl alcohol. The aqueous solution is incorporated with a crystallizing agent (defined below) in an amount of 10–20% of polyvinyl alcohol. After application, the aqueous solution is dried under specific conditions so that the amount of the crystallizing agent remaining in the adhesive layer is as small as possible, especially less than 5%. This remaining amount and the degree of crystallization in the adhesive layer are determined by the drying temperature, the amount of drying air, and the rate of drying. The drying temperature should be 100°–200° C., preferably 100°–140° C.

The aqueous solution of polyvinyl alcohol may contain, in addition to a crystallizing agent, a small amount of surface active agent and preservative. After drying, the adhesive or anti-tack layer should be 0.1–10 μm thick, preferably 2–5 μm thick.

The crystallizing agent used in the present invention is selected from water-soluble, low-molecular-weight alcohols, ethers, ketones, esters, carboxylic acids, amines, amides, etc. They may contain sulfur, halogen, or phosphorus atom. Their water-solubility should be higher than 1 wt %, preferably higher than 5 wt %, at 20° C. Their examples are listed below.

Monohydric alcohols such as cyclohexanol, benzyl alcohol, 2-ethylbutyl alcohol, and isoamyl alcohol.

Polyhydric alcohols such as ethylene glycol, 1,2-propylene glycol, 1,3-propylene glycol, hexylene glycol, 1,2-butylene glycol, 1,3-butylene glycol, glycerin, trimethylolpropane, and sorbitol.

Monoalkyl esters of said alcohols.

Nitrogen-containing compounds such as dimethylacetamide, monoethanolamine, diethanolamine, triethanolamine, N-methylpyrrolidone, cyclohexylamine, aniline, urea, and picoline.

Organic acids (and esters thereof) such as butyric acid, ethyl lactate, and triethyl phosphate.

Aldehydes such as furfural, acetylacetone, diacetone alcohol, and cyclohexane.

Acetals and ketones.

Sulfur-containing compounds such as dimethylsulfoxide.

Of these crystallizing agents, those organic compounds which have a boiling point of 120°–240° C. and a vapor pressure higher than 5 Torr (at 105° C.) are desirable because they do not cause mist formation and exhibit good storage stability. The vapor pressure of some samples is given below.

1,2-propylene glycol: 30 Torr 1,3-propylene glycol: 16 Torr

Ethylene glycol: 20 Torr 1,4-butanediol: 5.8 Torr 1,3-butanediol: 16 Torr

Dimethylacetamide: 60 Torr

Dimethylsulfoxide: 120 Torr

Of the crystallizing agents mentioned above, 1,2-propylene glycol, 1,3-propylene glycol, 1,3-butanediol, and 1,4-butanediol are desirable from the standpoint of leveling properties, storage stability, and wrinkling prevention. They remain in the adhesive layer in an amount less than 5% of the polyvinyl alcohol.

The adhesive or anti-tack layer of the present invention can be used for any photopolymer printing plate capable of being developed with water or aqueous medium, such as those disclosed in JP-A 60-211451, 60-173055, 63-8648, 2-175702, 1-108542, 4-3162, 1-219735, 1-31192, 2-305805, and 3-228060.

To further illustrate this invention, and not by way of limitation, the following examples are given, in which "parts" means "parts by weight".

EXAMPLE 1

In 964 parts of pure water was dissolved 25 parts of "Gosenol AH-26" (polyvinyl alcohol having a degree of saponification of 97.0–98.8%; The Nippon Synthetic Chemical Industry Co., Ltd.) and the mixture was stirred at 90° C. for 1 hour. After cooling to room temperature, the aqueous solution was slowly added with 10.7 parts of 1,2-propylene glycol and 0.3 part of "Epan 740" (Dai-ichi Kogyo Seiyaku Co., Ltd.) by stirring. Stirring was continued for 30 minutes. The resulting solution was applied to a 125 μm thick polyethylene terephthalate film ("E-500" Toyobo Co., Ltd.) at a rate of 6 m/min by reverse-roll coating. The coated film was dried at 105° C. for 3 minutes in a drier with an air velocity of 0.5 m/S. Thus there was obtained an adhesive layer, 1.9 μm thick. Upon examination by gas chromatography ("GC-7A", Shimadzu Corporation), the adhesive layer was found to contain 1.1% of 1,2-propylene glycol. To see if 1,2-propylene glycol is given off in the form of mist during drying, the drying procedure was repeated, with E-500 stuck on the inside of the drier. E-500 remained clean and no mist was visually detected at the exit of the drier. No contamination or staining was found in the apparatus near the drier.

EXAMPLE 2

In 958 parts of pure water was dissolved 25 parts of "Gosenol AH-26" in the same manner as in Example 1. The aqueous solution was added with 17 parts of 1,2-propylene glycol and 0.3 part of "Epan 740". The resulting solution was made into a 2.0 μm thick adhesive layer by coating and drying in the same manner as in Example 1. The adhesive or anti-tack layer was found to contain 2.5% of 1,2-propylene glycol. Mist and contamination with mist were not found. The IR spectrum of the adhesive (anti-tack) layer obtained in this example is shown in FIG. 1.

EXAMPLE 3

In 950 parts of pure water was dissolved 25 parts of "Gosenol AH-26" in the same manner as in Example 1. The aqueous solution was incorporated with 25 parts of 1,2-propylene glycol and 0.3 part of "Epan 740". The resulting solution was made into a 2.1 μm thick adhesive layer by coating and drying in the same manner as in Example 1. The adhesive layer was found to contain 3.7% of 1,2-propylene glycol. Mist and staining with mist were not found.

Reference Example 1

A photopolymer composition was prepared in the following manner. In 300 parts of tetrahydrofuran were dissolved 21.8 parts of hexamethylene diisocyanate, 15.4 parts of dimethylolpropionic acid, 7.6 parts of polytetramethylene glycol ("PG-100", Nippon Polyurethane Industry Co., Ltd.), and 1.0 part of dibutyltin dilaurate. The resulting solution was heated at 65° C. with stirring for 3 hours in a 1-liter flask to bring about reaction. To the reaction liquid was added with stirring at room temperature a solution prepared by dissolving in 100 parts of methyl ethyl ketone 55.3 parts of amino-terminated acrylonitrile-butadiene oligomer ("Hycar ATBNX 1300×16", Ube Industries Ltd.). The resulting polymer solution was freed of solvents by vacuum drying to give a polymer having an average molecular weight of 21000. This polymer (100 parts) was dissolved in 100 parts of methyl ethyl ketone. To the solution was added with stirring at room temperature 4.8 parts of lithium hydroxide dissolved in 100 parts of methyl alcohol. Stirring was continued for 30 minutes. Thus there was obtained a hydrophilic polymer (I).

The hydrophilic polymer (I) was dissolved and dispersed in 40 parts of toluene and 10 parts of water together with the following components.

- 45 parts of chlorinated polyethylene as a hydrophobic polymer ("H-135", Osaka Soda Co., Ltd.)
- 15 parts of styrene-butadiene rubber ("JSR 1507", Japan Synthetic Rubber Co., Ltd.)
- 28.5 parts of butadiene oligoacrylate ("PB-A", Kyoeisha Yushi Co., Ltd.)
- 1 part of benzyl dimethyl ketal ("Irgacure 651", Ciba Geigy Co., Ltd.) 0.5 part of hydroquinone monomethyl ether The mixture was subjected to kneading at 105° C. for thorough mixing and dissolution. After deaeration, there was obtained the desired photopolymer composition.

Reference Example 2

The photopolymer composition obtained in Reference Example 1 was sandwiched between a first polyester film (125 μm thick) and a second polyester film (having the adhesive layer prepared in Example 2) by pressing at 100° C. and 150 kg/cm² for 30 seconds, with the adhesive layer in contact with the photopolymer composition. There was obtained a 2.0 mm thick sheet as a printing plate stock substrate. To test the plate substrate, the second polyester film was peeled off, with the adhesive layer left on the photopolymer layer. The adhesive layer was found to be very smooth (like a mirror) and free of wrinkles. After repeated warping, the plate substrate was observed on a flat table at room temperature. It was found that the smooth surface was restored, with wrinkles disappeared.

The plate substrate was exposed through a negative in contact therewith for 5 minutes at an illuminance of 25 W/m² by a mercury lamp (Dai-Nippon Screen Co., Ltd.) With the negative removed, the exposed plate substrate was developed by brushing with neutral water containing 2 wt % sodium alkylnaphthalenesulfonate at 40° C. for 15 minutes. There was obtained relief of accurately reproduced image, which is 0.8 mm high. In addition, the relief allowed good ink reception and transfer and produced a sharp image.

Comparative Example 1

The same procedure as in Example 1 was repeated to prepare a cover film having an adhesive or anti-tack layer, except that the adhesive layer does not contain 1,2-propylene glycol. During the processing of the adhesive layer by the drier, no contamination occurred. This cover film was incorporated into the photopolymer laminate in the same way as in Example 2. When the polyester film was peeled off, the adhesive layer became wrinkled (looking like the human skin). Upon exposure and development in the same manner as in Example 3, the photopolymer layer gave rise to a photopolymerized image having wrinkles. These wrinkles caused uneven ink transfer.

In the case where the polyester film was peeled off in two strokes intentionally, a linear wrinkle occurred at the place where peeling was suspended. On standing overnight at room temperature, the wrinkles (looking like the human skin) and the linear wrinkle remained. Thus it was impossible to obtain the normal smooth surface.

Comparative Example 2

The same procedure as in Example 1 was repeated except that the 1,2-propylene glycol was replaced by a nucleating agent shown in Table 1. The results are also shown in Table 1.

Comparative Example 3

In 971 parts of pure water was dissolved 25 parts of "Gosenol GH-23" (polyvinyl alcohol having a saponification degree of 86.5–89.0%, The Nippon Synthetic Chemical Industry Co., Ltd.) with stirring at 90° C. for 1 hour. The aqueous solution was incorporated with 4 parts of polyethylene glycol having a molecular weight of 1000. Stirring was continued for 30 minutes. The resulting solution was made into a 1.9 μm thick adhesive layer in the same manner as in Example 1.

A 2.0 mm thick laminate (printing plate stock or substrate) was prepared in the same manner as in Reference Example 2 with the photopolymer composition obtained in Reference Example 1. It was possible to peel off the polyester film (as the uppermost layer) only with difficulty. The adhesive layer remaining on the photopolymer layer was found to have wrinkles resembling the human skin. The adhesive layer was found to contain 3.7% of 1,2-propylene glycol. Mist and contamination with mist were not found. On standing overnight at room temperature, the wrinkles remained and the adhesive layer was sticky. Further experiments (for development and printing) were not carried out.

EXAMPLE 4

The same procedure as in Example 1 was repeated to give an adhesive layer except that the 1,2-propylene glycol was replaced by 1,4-butanediol. The resulting adhesive layer was 2.0 μm thick and was found to contain 2.6% of 1,4-butanediol. Mist and contamination with mist were not found.

EXAMPLE 5

The same procedure as in Example 2 was repeated to give an adhesive layer except that the 1,2-propylene glycol was replaced by 1,4-butanediol. The resulting adhesive layer was 2.0 μm thick and was found to contain 4.9% of 1,4-butanediol. Mist and contamination with mist were not found.

EXAMPLES 9 to 16

The same procedure as in Example 1 was repeated except that the 1,2-propylene glycol was replaced by a nucleating agent shown in Table 1. The results are also shown in Table 1.

The results of Examples 1 to 16 and Comparative Examples 1 to 3 are shown in Table 1 below.

TABLE 1

| | crystallizing agent | | | | | | | | |
|---|---|---|---|---|---|---|---|---|---|
| | Name | boiling point | Vapor pressure (Torr) at 105° C. | Content | Mist occurrence | Coal-ability | Storage stability | Wrinkle occurrence | Absorbance at 1140 cm$^{-1}$ |
| Example 1 | 1,2-propylene glycol | 187° C. | 30 | 1.1 | none | good | good | none | 0.0213 |
| Example 2 | 1,2-propylene glycol | 187° C. | 30 | 2.5 | none | good | good | none | 0.0268 |
| Example 3 | 1,2-propylene glycol | 187° C. | 30 | 3.7 | none | good | good | none | 0.0299 |
| Example 4 | 1,4-butanediol | 235° C. | 5.8 | 2.6 | none | good | good | none | 0.0312 |
| Example 5 | 1,4-butanediol | 235° C. | 5.8 | 4.9 | none | good | good | none | 0.0350 |
| Example 6 | 1,4-butanediol | 235° C. | 5.8 | 4.6 | none | good | good | none | 0.0343 |
| Example 7 | 1,4-butanediol | 235° C. | 5.8 | 4.6 | none | good | good | none | 0.0343 |
| Example 8 | 1,2-propylene glycol | 187° C. | 30 | 1.2 | none | good | good | none | 0.0233 |
| Example 9 | 1,3-butanediol | 204° C. | 16 | 1.5 | none | good | good | none | 0.0288 |
| Example 10 | Isoamyl alcohol | 132° C. | 300 | 1.0 | none | good | good | none | 0.0153 |
| Example 11 | 2-ethylbutyl alcohol | 146° C. | 105 | 2.3 | none | good | good | none | 0.0271 |
| Example 12 | n-hexyl alcohol | 155° C. | 100 | 1.8 | none | good | good | none | 0.0213 |
| Example 13 | Furfuryl alcohol | 171° C. | 60 | 2.3 | none | good | good | none | 0.0254 |
| Example 14 | Glycerin | 290° C. | 0.2 | 5.8 | some | good | good | none | 0.0133 |
| Example 15 | Triethanolamine | 360° C. | 0.07 | 5.0 | none | fair | good | none | 0.0363 |
| Example 16 | Trimethylpropane | 292° C. | 0.4 | 3.5 | none | fair | good | none | 0.0205 |
| Comparative Example 1 | none | — | — | none | none | good | good | yes | 0.0095 |
| Comparative Example 2 | Ethyl alcohol | 78 | — | none | none | good | good | yes | 0.0089 |
| Comparative Example 3 | Polyethylene glycol (1000) | — | — | 14 | none | good | sticky | yes | 0.0091 |

EXAMPLE 6

The same procedure as in Example 3 was repeated to give an adhesive layer except that the 1,2-propylene glycol was replaced by 1,4-butanediol. The resulting adhesive layer was 2.0 μm thick and was found to contain 4.6% of 1,4-butanediol. Mist and contamination with mist were not found.

EXAMPLE 7

A 2.0 mm thick laminate sheet (printing plate stock or substrate) was prepared in the same manner as in Reference Example 2 from the photopolymer composition obtained in Reference Example 1 and the adhesive layer obtained in Example 6. When the cover film was peeled off, the adhesive layer remained free of wrinkles. Upon exposure and development in the same manner as in Reference Example 2, the plate substrate gave rise to a relief which allowed good ink reception and transfer.

EXAMPLE 8

The same procedure as in Example 1 was repeated to give an adhesive layer except that the polyethylene terephthalate film was replaced by a 95 μm thick chemical matte film ("TC-5002", Toyo Cloth Co., Ltd.). The resulting adhesive layer was 2.1 μm thick and was found to contain 1.2% of 1,2-propylene glycol. Using this coated film, a photopolymer laminate was prepared in the same manner as in Example 4. When the chemical matte film was peeled off, there occurred no wrinkles.

Note to Table 1: "mist occurrence" indicates whether or not the drier was contaminated or stained with mist, "coatability" was evaluated in terms of leveling, and "storage stability" was judged after storage for 1 month at room temperature.

As mentioned above, the present invention offers the following advantages. (1) The adhesive or anti-tack layer for the photopolymer printing plate stock or substrate is quite immune to wrinkling and hence it is easy to handle and permits the accurate reproduction of a negative image. (2) The composition for the adhesive layer does not give off mist which stains or contaminates the drier and other apparatus therearound if it is incorporated with a properly selected crystallizing agent. This eliminates the necessity of troublesome cleaning and saves labor for cleaning. (3) The adhesive layer is superior in storage stability regardless of temperature and humidity.

What is claimed is:

1. A laminate comprising in the following order:

a support;

an adhesive layer;

a photopolymerizable layer;

an anti-tack layer developable with an aqueous liquid, the anti-tack layer having an absorbance of 0.010 to 0.060 at 1140 cm$^{-1}$ per μm thickness of the anti-tack layer; and a cover film; wherein the anti-tack layer is prepared using polyvinyl alcohol and a water soluble crystallizing agent having a boiling point of 120° to 240° C.

2. A laminate as claimed in claim 1, wherein the absorbance is 0.020 to 0.060.

3. A laminate as claimed in claim 1, wherein the crystallizing agent comprises an alkylene glycol having two or more carbon atoms.

4. A laminate as claimed in claim 1, wherein the crystallizing agent comprises propylene glycol.

5. A laminate as claimed in claim 1, wherein the anti-tack layer does not interfere with the passage of light.

6. A laminate as claimed in claim 1, which is useful for photopolymer printing plates.

7. A laminate as claimed in claim 1, which is useful for flexographic photopolymer printing plates.

8. A laminate as claimed in claim 1, wherein the cover film comprises a polyethylene terephthalate film, a polyethylene film, a polypropylene film, or a polystyrene film.

9. A laminate as claimed in claim 1, wherein the anti-tack layer has a thickness of 0.1 to 10 µm.

10. A laminate comprising in the following order:

a support;

an adhesive layer;

a photopolymerizable layer;

an anti-tack layer developable with an aqueous liquid, the anti-tack layer having an absorbance of 0.010 to 0.060 at 1140 cm$^{-1}$ per µm thickness of the anti-tack layer; and a cover film; wherein said anti-tack layer is prepared using a water soluble crystallizing agent selected from the group consisting of alcohols, ethers, ketones, esters, carboxylic acids, amines, and amides.

11. A laminate comprising in the following order:

a support;

an adhesive layer;

a photopolymerizable layer;

an anti-tack layer developable with an aqueous liquid, the anti-tack layer having an absorbance of 0.010 to 0.060 at 1140 cm$^{-1}$ per µm thickness of the anti-tack layer; and a cover film; wherein said anti-tack layer is prepared using a water soluble crystallizing agent having a boiling point of 120° to 240° C. and a vapor pressure higher than 5 torr at 105° C.

12. A laminate as claimed in claim 10, wherein the anti-tack layer is prepared using polyvinyl alcohol.

13. A laminate as claimed in claim 2, wherein the anti-tack layer is prepared using polyvinyl alcohol.

14. A laminate as claimed in claim 1, wherein the anti-tack layer is prepared using polyvinyl alcohol and a water soluble crystallizing agent selected from the group consisting of monohydric alcohols, polyhydric alcohols, monoalkyl esters of alcohols, nitrogen-containing compounds, organic acids and esters thereof, aldehydes, acetals, ketones, and sulfur-containing compounds.

15. A laminate as claimed in claim 1, wherein the anti-tack layer is prepared using polyvinyl alcohol and one or more of a propylene glycol and a butane diol.

16. A laminate as claimed in claim 1, wherein the anti-tack layer is prepared using polyvinyl alcohol.

* * * * *